United States Patent
Nelson et al.

(10) Patent No.: US 7,450,378 B2
(45) Date of Patent: Nov. 11, 2008

(54) POWER MODULE HAVING SELF-CONTAINED COOLING SYSTEM

(75) Inventors: David F. Nelson, Redondo Beach, CA (US); James M. Nagashima, Cerritos, CA (US); Peter J. Savagian, Bloomfield Hills, MI (US); Gregory S. Smith, Woodland Hills, CA (US)

(73) Assignee: GM Global Technology Operations, Inc., Detroit, MI (US)

( * ) Notice: Subject to any disclaimer, the term of this patent is extended or adjusted under 35 U.S.C. 154(b) by 91 days.

(21) Appl. No.: 11/552,564

(22) Filed: Oct. 25, 2006

(65) Prior Publication Data

US 2008/0101013 A1 May 1, 2008

(51) Int. Cl.
*H05K 7/20* (2006.01)
*H01L 23/36* (2006.01)

(52) U.S. Cl. .................. 361/689; 361/699; 361/700; 361/715; 165/80.4; 165/80.5; 165/104.33; 165/185

(58) Field of Classification Search ......... 361/687–689, 361/698, 699, 700, 715, 721; 165/80.4, 80.5, 165/908, 104.33, 185; 257/714, 715; 62/64, 62/259.2; 174/15.1, 16.1
See application file for complete search history.

(56) References Cited

U.S. PATENT DOCUMENTS

| | | | | |
|---|---|---|---|---|
| 5,021,924 A | * | 6/1991 | Kieda et al. | 361/699 |
| 5,220,804 A | * | 6/1993 | Tilton et al. | 62/64 |
| 5,349,831 A | * | 9/1994 | Daikoku et al. | 62/376 |
| 6,377,458 B1 | * | 4/2002 | Morris et al. | 361/699 |
| 6,498,725 B2 | * | 12/2002 | Cole et al. | 361/700 |
| 6,889,515 B2 | * | 5/2005 | Tilton et al. | 62/259.2 |
| 7,092,254 B1 | * | 8/2006 | Monsef et al. | 361/699 |
| 7,133,286 B2 | * | 11/2006 | Schmidt et al. | 361/718 |
| 7,156,160 B2 | * | 1/2007 | Lee et al. | 165/104.33 |
| 7,184,269 B2 | * | 2/2007 | Campbell et al. | 361/700 |
| 7,210,304 B2 | * | 5/2007 | Nagashima et al. | 62/259.2 |
| 7,233,494 B2 | * | 6/2007 | Campbell et al. | 361/699 |
| 7,327,570 B2 | * | 2/2008 | Belady | 361/699 |

* cited by examiner

*Primary Examiner*—Michael V Datskovskiy

(57) ABSTRACT

A semiconductor module comprises a housing having a cavity therein, and at least one semiconductor device residing within the cavity. A cooling system is contained within the housing and comprises a dielectric fluid disposed within the housing and a flow passageway disposed through the housing. The flow passageway is fluidly coupled to the cavity, and the cooling system is configured to circulate the dielectric fluid through the flow passageway and onto the at least one semiconductor device.

19 Claims, 2 Drawing Sheets

POWER MODULE HAVING SELF-CONTAINED COOLING SYSTEM

TECHNICAL FIELD

The present invention generally relates to a liquid-cooled semiconductor module and, more specifically, to a power module having a self-contained cooling system, which is suited for use onboard an electric/hybrid vehicle.

BACKGROUND OF THE INVENTION

Certain semiconductor devices are known to generate excess heat during operation. This is especially true for power semiconductor devices, which are commonly utilized as switches or rectifiers in high-power electric circuits. Power inverters, for example, are deployed on electric and hybrid electric vehicles to provide three phase operating power to the vehicle's electric drive motor. Power inverters and other such devices must typically be cooled to ensure proper functioning. For this reason, the power modules housing such power devices are often provided with some form of cooling system. For example, conventional cooling systems commonly employ a cold plate (e.g., a heat sink) to transfer heat away from the power device. The heat sink may comprise a metal body (e.g., aluminum, copper, etc.) having a flat surface and a plurality of projections ("pin-fins") extending away therefrom. The flat surface of the heat sink is placed in thermal contact with the power device (e.g. soldered to a substrate supporting the power device), and the pin-fins are exposed to a cooling source, typically air or a coolant liquid (e.g., glycol water). During device operation, heat is conducted away from the power device and into the pin-fins, which are convectively cooled by the cooling source.

Simple heat sink cooling systems of the type describe above achieve less than optimal power device cooling. The conductive heat transfer from the power device to the cold plate is generally less effective than direct contact cooling methods wherein a coolant fluid physically contacts the power device. Also, if coolant fluid is utilized, heat dissipation may be further reduced by coolant stagnation. These limitations may be mitigated by employing a direct contact active cooling system, which utilizes a pump to circulate the coolant fluid over or onto the power device. The most effective ones of these systems typically direct a dielectric coolant onto the electrical components (e.g., switches, diodes, etc.) proximate a top portion of the power device. However, direct contact active cooling systems are also limited in certain respects. Such cooling systems tend to be relatively complex and expensive to employ. In addition, such cooling systems are typically not self-contained and thus require multiple interconnections between components. This makes the mounting/interchanging of a power module employing such a cooling system more difficult and may also lead to coolant fluid contamination and leakage problems.

It should thus be appreciated that it would be desirable to provide a cooling system that is thermally efficient, is fully contained within a semiconductor module, avoids fluid contamination and leakage problems, and facilitates the mounting/interchanging of the module. It should further be appreciated that it would advantageous if such a cooling system is of a reduced complexity and is relatively inexpensive to manufacture. Furthermore, other desirable features and characteristics of the present invention will become apparent from the subsequent detailed description and the appended claims, taken in conjunction with the accompanying drawings and the foregoing technical field and background.

SUMMARY OF THE INVENTION

A semiconductor module comprises a housing having a cavity therein, and at least one semiconductor device residing within the cavity. A cooling system is contained within the housing and comprises a dielectric fluid disposed within the housing and a flow passageway disposed through the housing. The flow passageway is fluidly coupled to the cavity, and the cooling system is configured to circulate the dielectric fluid through the flow passageway and onto the at least one semiconductor device.

DESCRIPTION OF THE DRAWINGS

The present invention will hereinafter be described in conjunction with the following drawing figures, wherein like numerals denote the elements, and.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary, or the following detailed description.

Figure 1:
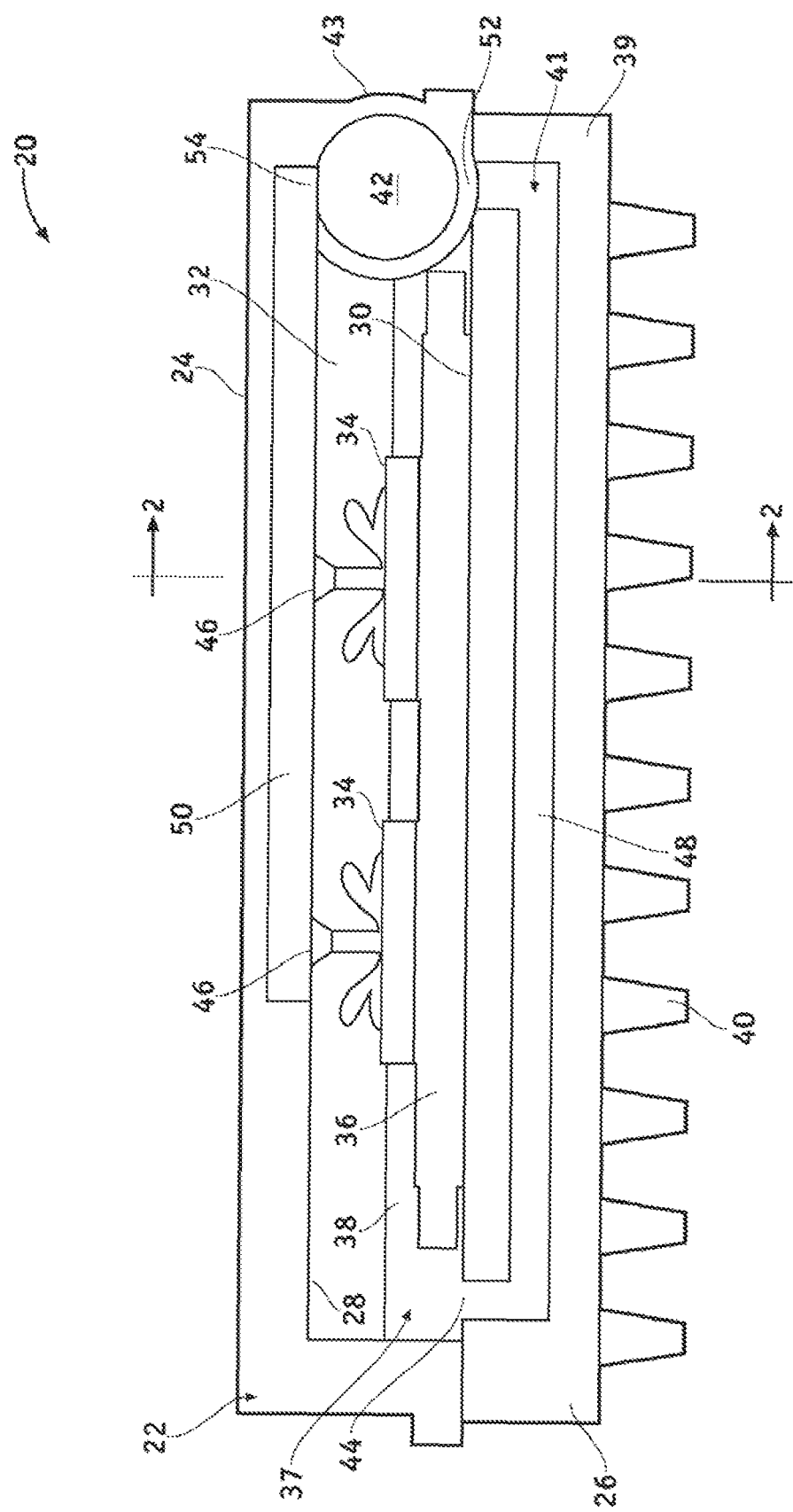
FIG. 1 is a first cross-sectional view of a semiconductor module in accordance with an exemplary embodiment of the present invention.
Figure 2:
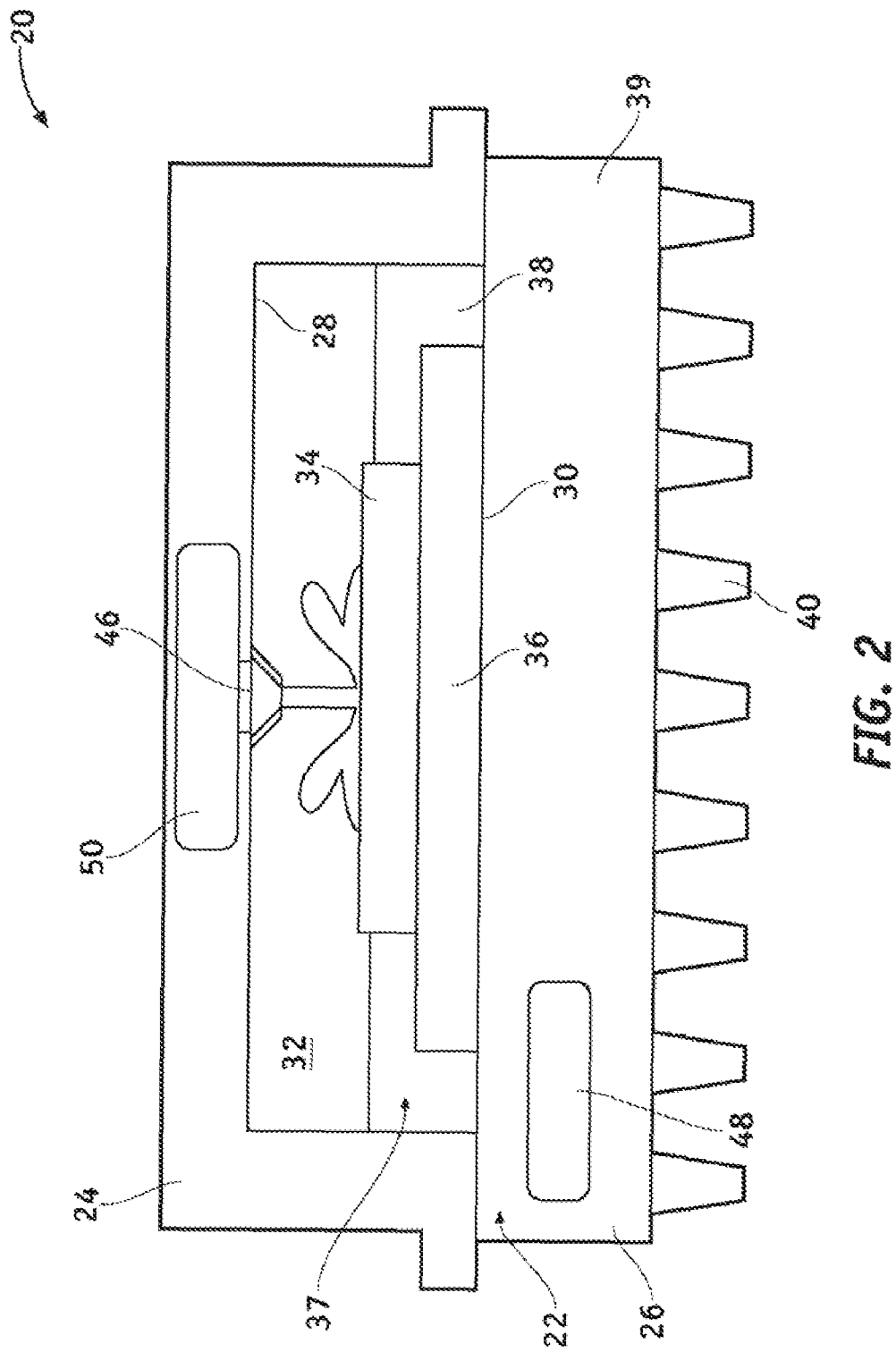
FIG. 2 is a second cross-sectional view of the semiconductor module shown in FIG. 1 taken along line 2-2.

FIG. 1 is a first cross-sectional view of a semiconductor module 20 in accordance with an exemplary embodiment of the present invention, and FIG. 2 is a second cross-sectional view of module 20 taken along line 2-2 in FIG. 1. Semiconductor module 20 may be a power module (e.g., an inverter module suitable for deployment on an electric or hybrid vehicle) and will thus be referred to herein as such. Power module 20 comprises a housing 22, which, in turn comprises a module cover 24 and a base 26. Base 26 may comprise, for example, a cold plate. The term cold plate is used herein in its broadest sense and encompasses any device (e.g., a heat sink) suitable for removing heat from module 20. Cover 24 may be molded from a suitable plastic, and cold plate 26 may be constructed from a thermally conductive metal, such as aluminum or copper. Cover 24 includes an inner surface 28, and cold plate 26 includes a support surface 30. Cover 24 is sealingly coupled to cold plate 26 such that inner surface 28 and support surface 30 cooperate to define a cavity 32 within housing 22. As will be appreciated by one skilled in the art, cover 24 may be sealingly coupled to cold plate 26 in a variety of manners. For example, cover 24 may be coupled to cold plate 26 via an adhesive or a plurality of fasteners. Alternatively, cover 24 may be molded to include a plurality of mechanical locking features that engage support surface 30, or cover 24 may simply be molded directly onto cold plate 26. If fasteners or mechanical locking features are utilized, an elastomer O-ring (not shown) may be disposed between inner surface 28 and support surface 30 to ensure that a hermetic seal is formed between cover 24 and cold plate 26.

One or more semiconductor devices 34 (e.g., power devices, such as inverters) are disposed within cavity 32 and coupled to support surface 30 of cold plate 26. In particular, power devices 34 are supported by and fixedly coupled to a substrate 36. Substrate 36 may be a direct bonded copper substrate (e.g., a copper-coated aluminum oxide or ceramic substrate), and power devices 34 may be soldered to substrate 36, however, it should be appreciated that other substrates and attachment means may be utilized. Substrate 36 is coupled to (e.g., soldered to) support surface 30 thereby placing power devices 34 in thermal communication with cold plate 26.

During operation of semiconductor module 20, heat is generated by power devices 34. In particular, heat is produced by electrical components (e.g., power switches, diodes, etc.) and wire bonds employed by power devices 34. A cooling system is consequently deployed within housing 22 to dissipate the heat produced by power devices 34 by actively circulating a coolant fluid 38 through housing 22 and over or onto power devices 34. As described in more detail below, the cooling system preferably directs one or more fluid streams or atomized sprays of coolant fluid directly onto top surfaces of power devices 34 to directly cool the electrical components and wire bonds and, therefore, to maximize convective heat dissipation.

Coolant fluid 38 is preferably a dielectric liquid. As will be apparent to one skilled in the art, the particular dielectric liquid selected will depend upon device chemistry and application. Suitable dielectric liquids may include, but are not limited to, fluorocarbons, silicone oils, and polyalphaolephins. Coolant fluid 38 collects within a coolant fluid reservoir 37, which is disposed within cavity 32 and which is generally defined by support surface 30 and inner surface 28. As illustrated, reservoir 37 may partially or fully envelop one or more power devices 34, however, it should be understood that is by no means necessary the fluid contained within coolant fluid reservoir 37 contact any portion of power devices 34. Indeed, it may be preferable that the upper surfaces of power devices 34 are exposed so as to permit direct impingement of coolant fluid 38 thereon. In other embodiments, power devices 34 may be entirely submerged by coolant fluid 38, which may substantially fill cavity 32. Embodiments of this type may provide certain advantages over embodiments wherein power devices 34 are not fully submerged by fluid 38. These advantages include, but are not limited to, improved thermal performance and/or decreased sensitivity to device orientation, e.g., a decreased possibility of gas ingestion by a pump (e.g., pump 42 described below) disposed within semiconductor module 20 when module 20 is at an incline or when module 20 experiences g forces.

In the exemplary embodiment, cold plate 26 comprises a heat sink having a body portion 39 including support surface 30. A plurality of projections 40 ("pin-fins") is coupled (e.g., integrally) to body portion 38 and extends away therefrom substantially opposite support surface 30. Pin-fins 40 increase the surface area of the lower portion of cold plate 26 and thus promote the convective cooling of cold plate 26. Pin-fins 40 are exposed to a cooling source in the well-known manner; e.g., pin-fins 40 may be exposed to an air source, which may be directed over pin-fins 40 by a fan (not shown). Alternatively, pin-fins 40 may be exposed to a second liquid coolant (e.g., glycol water). In this manner, cold plate 26 cooperates with substrate 36 to form a conductive heat dissipation path. That is, excess heat generated by power devices 34 is conductively absorbed by substrate 36 and travels through body portion 39 into pin-fins 40. The cooling source applied to pin-fins 40 then convectively dissipates the excess heat thereby cooling cold plate 26.

As stated previously, coolant fluid 38 is actively circulated through housing 22 by a cooling system contained within power module 20. This cooling system comprises a flow passageway 41 (FIG. 1) through housing 22 having an inlet and at least one outlet. Additionally, the cooling system may further comprise a pump 42 (FIG. 1) fluidly coupled to flow passage 41. In the illustrated embodiment, flow passage 41 includes a reservoir inlet 44 disposed through support surface 30 and a plurality of impingement outlets 46 disposed through inner surface 28. Impingement outlets 46 are preferably positioned so as to direct circulating coolant fluid 38 onto the top surfaces of power devices 34; e.g., each outlet 46 may be disposed substantially above a different one of power devices 34 as shown in FIGS. 1 and 2. Impingement outlets 46 may assume any form suitable for directing fluid 38 onto power device 34. For example, impingement outlets 46 may each take the form of one or more holes created through inner surface 28 of cover 24. However, impingement outlets 46 each preferably comprise a fluid flow jet (illustrated) configured to create a stream of coolant fluid, or a spray nozzle configured to produce a fine or atomized mist. A particular module may employ fluid flow jets, spray nozzles, or a combination of jets and nozzles depending upon desired performance characteristics. Relative to fluid flow jets, spray nozzles tend to provide more efficient thermal cooling. Conversely, fluid flow jets help to preserve coolant fluid quality and may permit pump 42 to be of the low pressure variety thereby reducing cost and increasing system reliability.

Although only one flow passageway is shown in FIGS. 1 and 2, it should be appreciated that certain embodiments of the inventive semiconductor module may include multiple (e.g., dual) flow passages. The flow passage or passages are preferably formed through a peripheral portion of the cold plate so as to substantially avoid direct exposure to the conductive heat path provided through the substrate and cold plate. Additionally, it will be understood by one skilled in the art that the portion of the flow passageway (or passageways) formed through the cold plate may assume a variety of shapes and configurations (e.g., a serpentine or lattice configuration) to increase the length of the flow passage and, therefore, to maximize heat transfer from the coolant fluid to the cold plate.

Referring still to exemplary module 20, flow passage 41 comprises two flow passage sections: a first flow passage section 48 formed through cold plate 26, and a second flow passage section 50 formed through cover 24 (e.g., through a top portion of cover 24). First flow passage section 48 includes reservoir inlet 44, and second section 50 includes the plurality of impingement outlets 46. Pump 42 is disposed within housing 22 and fluidly coupled between first flow passage section 48 and second flow passage section 50. For example, pump 42 may reside within a peripheral portion 43 (FIG. 1) of cover 24, and be fluidly coupled between an outlet 52 of flow passage 48 and an inlet 54 of flow passage 50. When energized, pump 42 circulates coolant fluid 38 through flow passage 41 and over power devices 34. More specifically, under the influence of pump 42, coolant fluid 38 is first drawn from reservoir 37 into reservoir inlet 44 of flow passage section 48. The coolant fluid 38 then flows through flow passage section 48 and into pump 42. Next, pump 42 expels coolant fluid 38 into flow passage section 50. The expelled coolant fluid 38 flows through flow passage section 50 until reaching impingement outlets 46, which then direct coolant fluid 38 onto power devices 34. After impinging the upper surfaces of power devices 34, the coolant fluid 38 returns to coolant reservoir 37 and the cycle is repeated.

When coolant fluid 38 impinges upon the upper surfaces of power devices 34, heat is transferred from device 34 to fluid 38 thus providing a convective heat dissipation path. This results in heat transfer from devices 34 to coolant fluid 38. In a heated condition, coolant fluid 38 flows into coolant fluid reservoir 37 and is ultimately drawn into reservoir inlet 44. As the heated coolant fluid 38 flows through flow passage section 48, cold plate 26 causes fluid 38 to cool in the manner described above. As shown in FIG. 1, flow passage section 48 preferably spans the majority of the length of cold plate 26 to maximize heat dissipation. Furthermore, as shown in FIG. 2, the width of low passage section 48 is preferably substantially less than that of cold plate 26 to increase heat dissipation along the conductive path described above.

It should be gathered from the foregoing description that module 20 is provided with two separate heat dissipation paths: a conductive cooling path described above (i.e., through the bottom of devices 34, substrate 36, body portion 39, and pin-fins 40), and a convective cooling path (i.e., through the tops of devices 34, circulated coolant fluid 38, and pin-fins 40). In this manner, the cooling of power electronics devices 34 is substantially increased. Moreover, the separate heat dissipation paths provide redundancy, which may permit the continued operation of power module 20 in the event of a failure in the convective cooling path (e.g., failure of pump 42, blockage in flow passage 41, etc.).

In view of the above, it should be appreciated that a cooling system has been provided that is thermally efficient and that is fully contained within a semiconductor module. It should further be appreciated that the cooling system is of a reduced complexity and is relatively inexpensive to manufacture. While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A semiconductor module, comprising:
   a housing having a cavity therein, said housing comprising:
      a cover; and
      a cold plate sealingly coupled to said cover;
   at least one semiconductor device residing within the cavity; and
   a cooling system contained within said housing, said cooling system comprising:
      a flow passageway though said housing and fluidly coupled to the cavity; and
      a dielectric fluid disposed within said housing, said cooling system configured to circulate said dielectric fluid through said flow passageway and onto said at least one semiconductor device.

2. A semiconductor module according to claim 1 wherein said cold plate is a heat sink.

3. A semiconductor module according to claim 1 wherein said flow passageway extends through said cover and through said cold plate.

4. A semiconductor module according to claim 3 wherein said flow passageway includes an inlet port formed in said cold plate and at least one outlet port formed in said cover.

5. A semiconductor module according to claim 4 wherein said at least one outlet port comprises a jet configured to deliver a stream of water onto said at least one semiconductor device.

6. A semiconductor module according to claim 4 wherein said at least one semiconductor device comprises a plurality of semiconductor devices, and wherein said at least one outlet port comprises a plurality of outlet ports each formed in said cover so as to conduct said dielectric fluid over a different one of said plurality of semiconductor devices.

7. A semiconductor module according to claim 1 wherein said cooling system comprises a pump in fluid communication with said flow passageway.

8. A semiconductor module according to claim 7 wherein said pump is substantially disposed within said cover.

9. A semiconductor module according to claim 1 wherein said cooling system is configured to cause said dielectric fluid to directly impinge upon an upper surface of said at least one semiconductor device.

10. A semiconductor module according to claim 1 further comprising a substrate supporting said at least one semiconductor device, said substrate coupled to said cold plate.

11. A power module configured to circulate a dielectric fluid therein, comprising:
    a housing comprising:
       a cover having an inner surface, and
       a cold plate having a support surface, said cold plate sealingly coupled to said cover to define a cavity within said housing configured to receive the dielectric fluid therein;
    a flow passage formed through said cover and cold plate, said flow passage including an inlet port disposed through said support surface and an outlet port disposed through said inner surface;
    at least one power device residing within the cavity and coupled to said support surface; and
    a pump disposed within said housing and in fluid communication with the flow passage, said pump configured to circulate the dielectric fluid through the flow passage and onto said at least one power device.

12. A power module according to claim 11 wherein said outlet port is disposed substantially above said at least one power device.

13. A power module according to claim 11 wherein said flow passage is formed through a peripheral portion of said cold plate.

14. A power module according to claim 11 wherein said cold plate comprises a heat sink having a plurality of pin-fins extending away therefrom substantially opposite said support surface.

15. A power module according to claim 11 wherein said cover comprises:
    a peripheral portion, said pump residing substantially within said peripheral portion; and
    a top portion coupled to said peripheral portion, said outlet formed in said top portion.

16. A power module according to claim 11, wherein a first section of said flow passes through said cold plate, and said first passage section being substantially U-shaped.

17. A power module according to claim 16 further comprising a coolant fluid reservoir within the cavity.

18. A power module according to claim 17 wherein said first passage section is fluidly coupled between said reservoir and said pump.

19. A power module, comprising:
    a cover having a first flow passage therethrough including an impingement outlet;
    a cold plate sealingly coupled to said cover and forming a cavity therewith, said cold plate having a second flow passage therethrough including a reservoir inlet;
    at least one power device residing within the cavity and coupled to said cold plate, said at least one power device disposed substantially beneath said impingement outlet;
    a dielectric fluid disposed within the cavity; and
    a pump substantially residing within said cover and fluidly coupled between said first flow passage and said second flow passage, said pump configured to draw said dielectric fluid through said reservoir inlet, conduct said dielectric fluid through said first and second flow passages, and dispense said dielectric fluid through said impingement outlet onto said at least one power device.

* * * * *